United States Patent
Chen et al.

(10) Patent No.: US 8,756,776 B1
(45) Date of Patent: Jun. 24, 2014

(54) METHOD FOR MANUFACTURING A DISK DRIVE MICROACTUATOR THAT INCLUDES A PIEZOELECTRIC ELEMENT AND A PERIPHERAL ENCAPSULATION LAYER

(75) Inventors: Yih-Jen D. Chen, Fremont, CA (US); Robert J. McNab, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 1288 days.

(21) Appl. No.: 12/579,263

(22) Filed: Oct. 14, 2009

Related U.S. Application Data

(62) Division of application No. 11/298,368, filed on Dec. 9, 2005, now abandoned.

(51) Int. Cl.
*G11B 5/84* (2006.01)
*H01L 41/22* (2013.01)

(52) U.S. Cl.
USPC ........... 29/25.35; 29/603.03; 29/841; 29/846; 360/291.9; 360/294.4

(58) Field of Classification Search
USPC .............. 29/25.35, 603.03, 603.04, 841, 842, 29/846; 360/291.9, 294.4, 292; 73/514.34
See application file for complete search history.

(56) References Cited

U.S. PATENT DOCUMENTS

| | | | |
|---|---|---|---|
| 4,845,399 A | 7/1989 | Yasuda et al. | |
| 5,305,507 A | 4/1994 | Dvorsky et al. | |
| 5,703,425 A | 12/1997 | Feral et al. | |
| 5,894,651 A | 4/1999 | Dvorsky et al. | |
| 5,920,145 A | 7/1999 | Wu et al. | |
| 5,920,978 A | 7/1999 | Koshikawa et al. | |
| 5,929,497 A | 7/1999 | Chavan et al. | |
| 6,052,879 A | 4/2000 | Wu et al. | |
| 6,109,113 A | 8/2000 | Chavan et al. | |
| 6,136,212 A | 10/2000 | Mastrangelo et al. | |
| 6,140,144 A | 10/2000 | Najafi et al. | |
| 6,291,930 B1 | 9/2001 | Sager | |
| 6,393,681 B1 | 5/2002 | Summers | |
| 6,487,045 B1 | 11/2002 | Yanagisawa | |
| 6,513,382 B2 * | 2/2003 | Tanaka et al. | .......... 73/514.34 X |
| 6,570,730 B1 | 5/2003 | Lewis et al. | |

(Continued)

FOREIGN PATENT DOCUMENTS

JP    63060617 A  *  3/1988

OTHER PUBLICATIONS

English Language Translation of Japanese Patent Publication (Certified), JP 63-60617, Jun. 2013.*

(Continued)

*Primary Examiner* — A. Dexter Tugbang

(57) ABSTRACT

A method of manufacturing a microactuator. The method includes providing a sheet of a piezoelectric material having an electrically conductive layer on at least one side of the sheet. The method includes cutting the sheet to form a plurality of piezoelectric elements. Each of the piezoelectric elements includes a first element side with an electrically conductive layer. Each first element side includes a peripheral portion and an exposed portion interior to the peripheral portion. The method includes forming an encapsulation layer over the peripheral portion and not over the exposed portion of at least one of the sides. The encapsulation layer comprises a material of lesser electrical conductivity than the electrically conductive layer. An apparatus for manufacturing the microactuators may also be provided that includes a first fixture and first and second alignment combs.

5 Claims, 13 Drawing Sheets

(56) References Cited

U.S. PATENT DOCUMENTS

| | | |
|---|---|---|
| 6,617,762 B2 | 9/2003 | Kurano et al. |
| 6,639,761 B1 | 10/2003 | Boutaghou et al. |
| 6,661,084 B1 | 12/2003 | Peterson et al. |
| 6,661,618 B2 | 12/2003 | Fujiwara et al. |
| 6,661,619 B2 | 12/2003 | Nishida et al. |
| 6,703,767 B1 | 3/2004 | Summers |
| 6,757,140 B1 | 6/2004 | Hawwa |
| 6,807,030 B1 | 10/2004 | Hawwa et al. |
| 6,870,709 B2 | 3/2005 | Shimanouchi et al. |
| 6,883,215 B2 | 4/2005 | Takeuchi et al. |
| 6,928,722 B2 | 8/2005 | Yanagisawa |
| 7,082,671 B2 | 8/2006 | Yanagisawa |
| 7,151,650 B2 | 12/2006 | Lee |
| 7,152,290 B2 * | 12/2006 | Junhua et al. ............... 29/25.35 |
| 7,280,319 B1 | 10/2007 | McNab |
| 7,352,538 B2 | 4/2008 | Kurihara et al. |
| 7,420,785 B2 | 9/2008 | Yamazaki et al. |
| 8,643,980 B1 | 2/2014 | Fowler et al. |
| 2002/0075605 A1 | 6/2002 | Nishida et al. |
| 2002/0080532 A1 | 6/2002 | Fujiwara et al. |
| 2002/0191342 A1 | 12/2002 | Yanagisawa |
| 2003/0223154 A1 | 12/2003 | Yao |
| 2004/0070885 A1 | 4/2004 | Kikkawa et al. |
| 2004/0095686 A1 | 5/2004 | Kuwajima et al. |
| 2004/0100736 A1 | 5/2004 | Kuwajima et al. |
| 2004/0130831 A1 | 7/2004 | Kuwajima et al. |
| 2004/0190175 A1 | 9/2004 | Chey et al. |
| 2004/0201925 A1 | 10/2004 | Huha et al. |
| 2004/0201926 A1 | 10/2004 | Hancer et al. |
| 2007/0291419 A1 | 12/2007 | Lee et al. |
| 2008/0024933 A1 | 1/2008 | Yao et al. |
| 2008/0198511 A1 | 8/2008 | Hirano et al. |

OTHER PUBLICATIONS

Office Action dated May 7, 2008 from U.S. Appl. No. 11/298,368, filed Dec. 9, 2005, 7 pages.

Office Action dated Sep. 9, 2008 from U.S. Appl. No. 11/298,368, filed Dec. 9, 2005, 9 pages.

Office Action dated Feb. 9, 2009 from U.S. Appl. No. 11/298,368, filed Dec. 9, 2005, 5 pages.

Office Action dated Feb. 10, 2009 from U.S. Appl. No. 11/298,368, filed Dec. 9, 2005, 6 pages.

Office Action dated Jul. 16, 2009 from U.S. Appl. No. 11/298,368, filed Dec. 9, 2005, 15 pgaes.

Monk, David J., et al., "Media Compatible Packaging and Environmental Testing of Barrier Coating Encapsulated Silicon Pressure Sensors", Solid-State Sensor and Actuator Workshop, Hilton Head, South Carolina, Jun. 2-6, pp. 36-41, 1996.

Monk, David J., "Thin Film Organic Passivation Coatings for Media Compatible Pressure Sensors", Motorola Inc. Technical Developments, pp. 29-30, Jul. 1995.

Bitko, Gordon, "Annealing Thin Film Parylene Coatings for Media Compatible Pressure Sensors", Motorola Inc. Technical Developments, pp. 92-94, Aug. 1996.

* cited by examiner

US 8,756,776 B1

METHOD FOR MANUFACTURING A DISK DRIVE MICROACTUATOR THAT INCLUDES A PIEZOELECTRIC ELEMENT AND A PERIPHERAL ENCAPSULATION LAYER

CROSS-REFERENCE TO RELATED APPLICATIONS

This patent application claims priority under 35 U.S.C. section 121 as a divisional of pending U.S. patent application Ser. No. 11/298,368, entitled "METHOD FOR MANUFACTURING A DISK DRIVE MICROACTUATOR THAT INCLUDES A PIEZOELECTRIC ELEMENT AND A PERIPHERAL ENCAPSULATION LAYER" and filed on Dec. 9, 2005, which is hereby incorporated by reference herein in its entirety.

FIELD OF THE INVENTION

The present invention relates generally to disk drives, and in particular to a method and apparatus for manufacturing a disk drive microactuator that includes a piezoelectric element and a peripheral encapsulation layer.

BACKGROUND

The typical hard disk drive includes a head disk assembly (HDA) and a printed circuit board assembly (PCBA) attached to a disk drive base of the HDA. The head disk assembly includes at least one disk (such as a magnetic disk), a spindle motor for rotating the disk, and a head stack assembly (HSA). The printed circuit board assembly includes a servo control system in the form of a disk controller for generating servo control signals. The head stack assembly includes at least one head, typically several, for reading and writing data from and to the disk. The head stack assembly is controllably positioned in response to the generated servo control signals from the disk controller. In so doing, the attached heads are moved relative to tracks disposed upon the disk.

The head stack assembly includes an actuator assembly, at least one head gimbal assembly, and a flex circuit assembly. A conventional "rotary" or "swing-type" actuator assembly typically includes a rotary actuator having an actuator body. The actuator body has a pivot bearing cartridge to facilitate rotational movement of the actuator assembly. An actuator coil is supported by the actuator body and is configured to interact with one or more magnets, typically a pair, to form a voice coil motor. One or more actuator arms extend from an opposite side of the actuator body.

The spindle motor typically includes a rotatable spindle motor hub, a magnet attached to the spindle motor hub, and a stator. The stator typically includes a series of coils that are in electrical communication with the printed circuit board assembly. With this general configuration, the various coils of the stator are selectively energized to form an electromagnetic field that pulls/pushes on the magnet, thereby imparting a rotational motion onto the spindle motor hub. Rotation of the spindle motor hub results in the rotation of the attached disks.

A topic of concern is the controlled positioning of the heads in relation to tracks of the disks. The pivoting motion of the rotary actuator provides a basic mode of actuation of positioning the heads. Prior art attempts have been directed towards providing a secondary actuation of the heads, for example to increase bandwidth or track-following resolution. Such a configuration has been referred to as a dual-stage actuation or microactuation. It is contemplated that there is need in the art for an improved microactuator configuration and the various methodologies for fabricating the related components.

SUMMARY

A method of manufacturing microactuators for use in a disk drive is provided. The method includes providing a sheet of a piezoelectric material having an electrically conductive layer on at least one side of the sheet. The method further includes cutting the sheet to form a plurality of piezoelectric elements. Each of the piezoelectric elements includes a first element side with an electrically conductive layer. Each first element side includes a peripheral portion and an exposed portion disposed interior to the peripheral portion. The method further includes forming an encapsulation layer over the peripheral portion and not over the exposed portion of at least one of the first element sides. The encapsulation layer comprises a material of lesser electrical conductivity than the electrically conductive layer.

According to another aspect of the present invention, there is provided an apparatus for manufacturing a plurality of piezoelectric microactuators each for use in a disk drive. The apparatus includes a first fixture including a fixture base and a plurality of protrusions extending from the fixture base. Each protrusion includes a distal support surface that is approximately the same size as an exposed portion of a first side of a piezoelectric element. The apparatus further includes a first alignment comb including a plurality of first tines. The first tines are spaced to position the piezoelectric element between respective ones of the first tines. The apparatus further includes a second alignment comb including a plurality of second tines. The second tines are spaced to position the piezoelectric element between respective ones of the second tines. The second tines are oriented approximately orthogonally relative to the first tines.

According to another aspect of the present invention, there is provided a microactuator for use in a disk drive. The microactuator includes a piezoelectric element defining a first element side. The first element side includes a first peripheral portion and a first exposed portion disposed interior to the first peripheral portion. The microactuator further includes a first electrically conductive layer disposed upon the first peripheral portion and the first exposed portion. The microactuator further includes an encapsulation layer disposed over the first peripheral portion and not over the first exposed portion. The encapsulation layer comprises a material of lesser electrical conductivity than the electrically conductive layer.

According to yet another embodiment of the present invention, there is provided a disk drive. The disk drive includes a disk drive base, a spindle motor coupled to the disk drive base, a coarse actuator rotatably coupled to the disk drive base, and a microactuator coupled to the coarse actuator. The microactuator is as described above.

DESCRIPTION OF THE PREFERRED EMBODIMENTS

Figure 1:
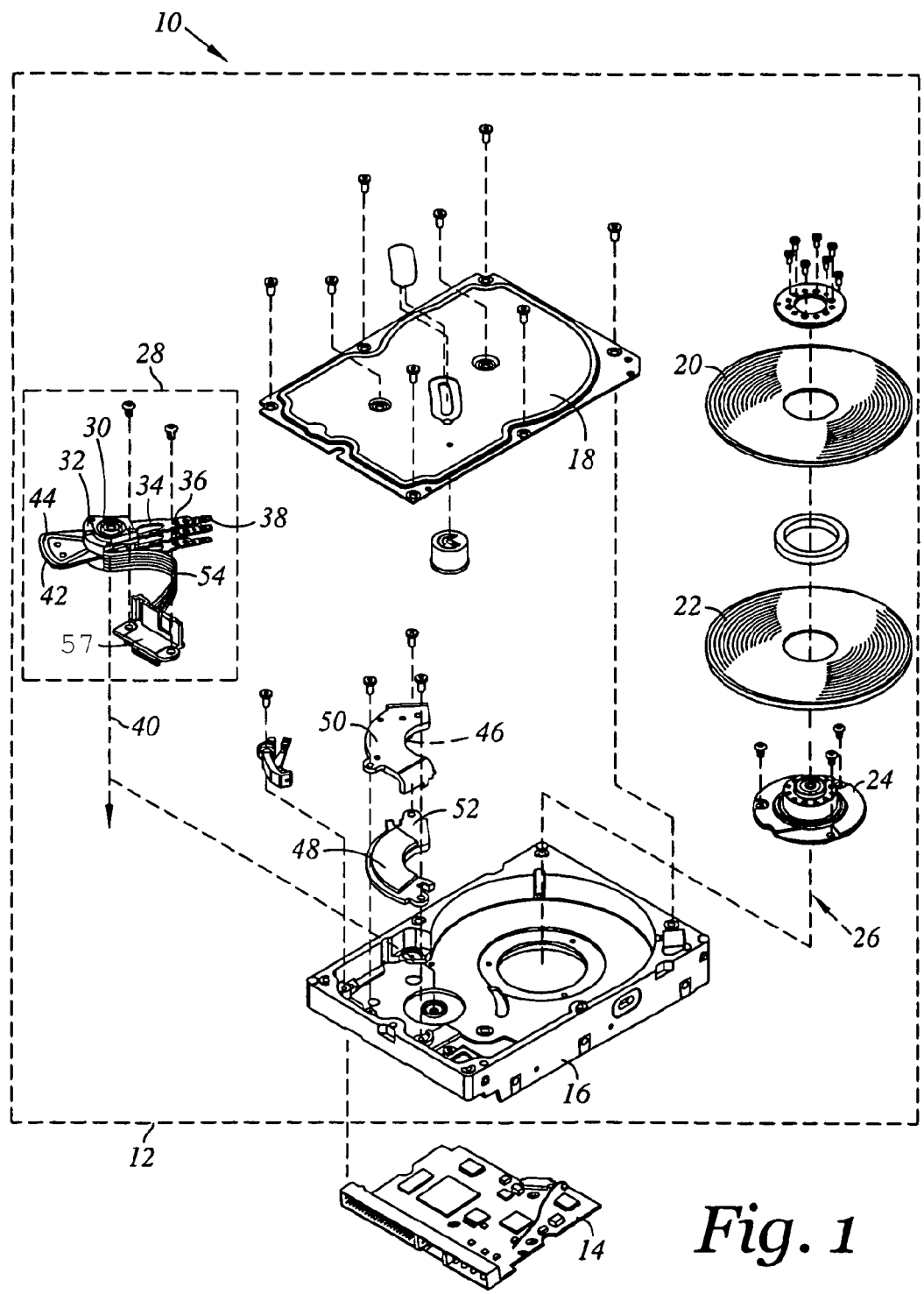
FIG. 1 is an exploded top perspective view of a disk drive.

Referring now to FIG. 1, there is depicted an exploded perspective view of a disk drive 10 capable of incorporating an embodiment of the present invention (details of which are discussed below and shown in additional figures). The disk drive 10 includes a head disk assembly (HDA) 12 and a printed circuit board assembly (PCBA) 14. The head disk assembly 12 includes a disk drive housing having disk drive housing members, such as a disk drive base 16 and a cover 18. The disk drive base 16 and the cover 18 collectively house disks 20, 22. A single disk or additional disks may be utilized. The disks 20, 22 each include a disk inner diameter, and a plurality of tracks for storing data. The disks 20, 22 may be of a magnetic recording type of storage device, however, other arrangements such as optical recording may be utilized. The head disk assembly 12 further includes a spindle motor 24 for rotating the disks 20, 22 about a disk rotation axis 26. The head disk assembly 12 further includes a head stack assembly 28 rotatably attached to the disk drive base 16 in operable communication with the disks 20, 22. The head stack assembly 28 includes a rotary actuator 30. The rotary actuator 30 may be considered a course actuator.

The rotary actuator 30 includes an actuator body 32 and actuator arms 34 that extend from the actuator body 32. Distally attached to the actuator arms 34 are suspension assemblies 36 (for ease of illustration only the topmost actuator arm and suspension assembly are denoted). The suspension assemblies 36 respectively support heads 38. The suspension assemblies 36 with the heads 38 are referred to as head gimbal assemblies. It is contemplated that the number of actuator arms and suspension assemblies may vary depending upon the number of disks and disk surfaces utilized.

Each head 38 typically includes a transducer for writing and reading data. Each transducer typically includes a writer and a read element. In magnetic recording applications, the transducer's writer may be of a longitudinal or perpendicular design, and the read element of the transducer may be inductive or magnetoresistive. In optical and magneto-optical recording applications, the head 38 may also include an objective lens and an active or passive mechanism for controlling the separation of the objective lens from a disk surface of the disks 20, 22. Each of the disks 20, 22 includes opposing disk surfaces. In magnetic recording applications the disk surface typically includes one or more magnetic layers. Data may be recorded along data annular regions on a single disk surface or both.

The head stack assembly 28 may be pivoted such that each head 38 is disposed adjacent to the various data annular regions from adjacent the outer diameter to adjacent the inner diameter of each of the disks 20, 22. In the embodiment shown, the actuator body 32 includes a bore, and the rotary actuator 30 further includes a pivot bearing cartridge engaged within the bore for facilitating the actuator body 32 to rotate between limited positions about an axis of rotation 40. The rotary actuator 30 further includes a coil support 42 that extends from one side of the actuator body 32 opposite the actuator arms 34. The coil support 42 is configured to support an actuator coil 44.

First and second magnets 46, 48 are supported by magnet supports 50, 52 which are attached to the disk drive base 16 (the first magnet 46 is denoted in dashed lining and it is understood that it is disposed at an underside of the magnet support 50). The actuator coil 44 interacts with the first and second magnets 46, 48 to form a voice coil motor for controllably rotating the actuator 30. The head stack assembly 28 further includes a flex cable assembly 54 and a cable connector 57. The cable connector 57 is attached to the disk drive base 16 and is disposed in electrical communication with the printed circuit board 14. The flex cable assembly 54 supplies current to the actuator coil 44 and carries signals between the heads and the printed circuit board assembly 14.

Figure 2:
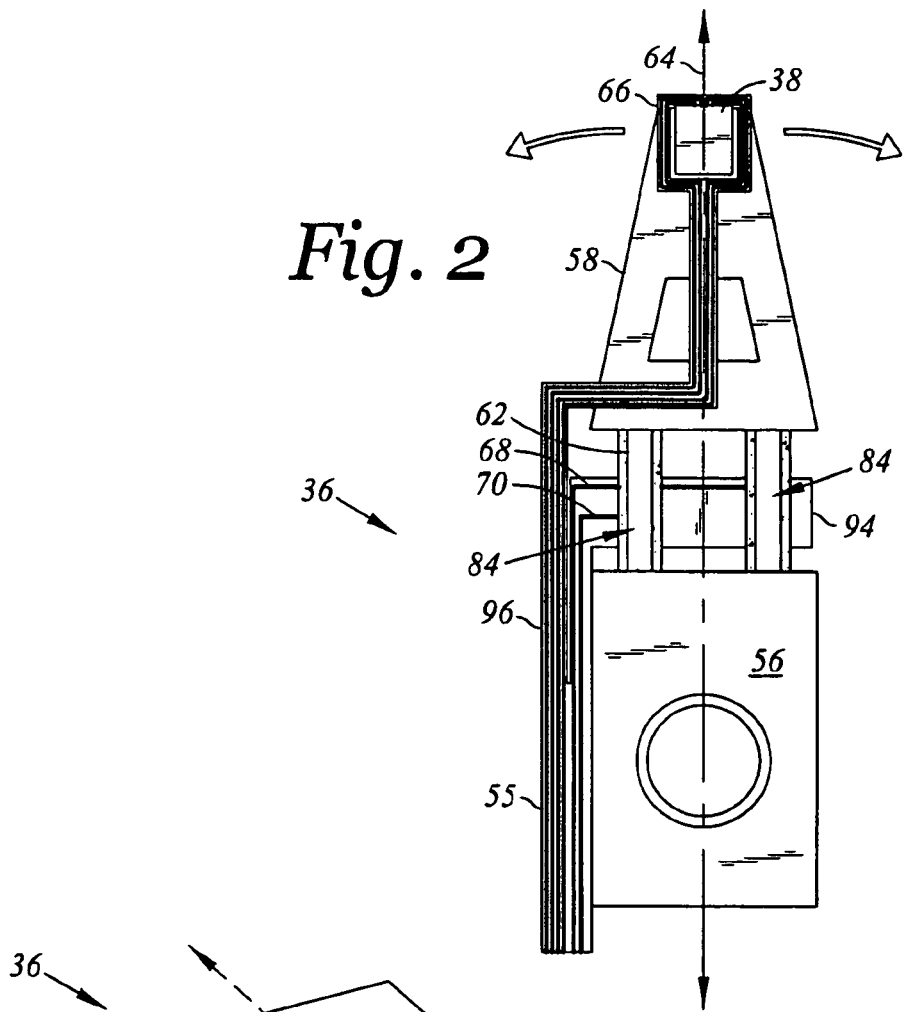
FIG. 2 is a bottom plan view of a portion of a head stack assembly including a pair of microactuators.
Figure 3:
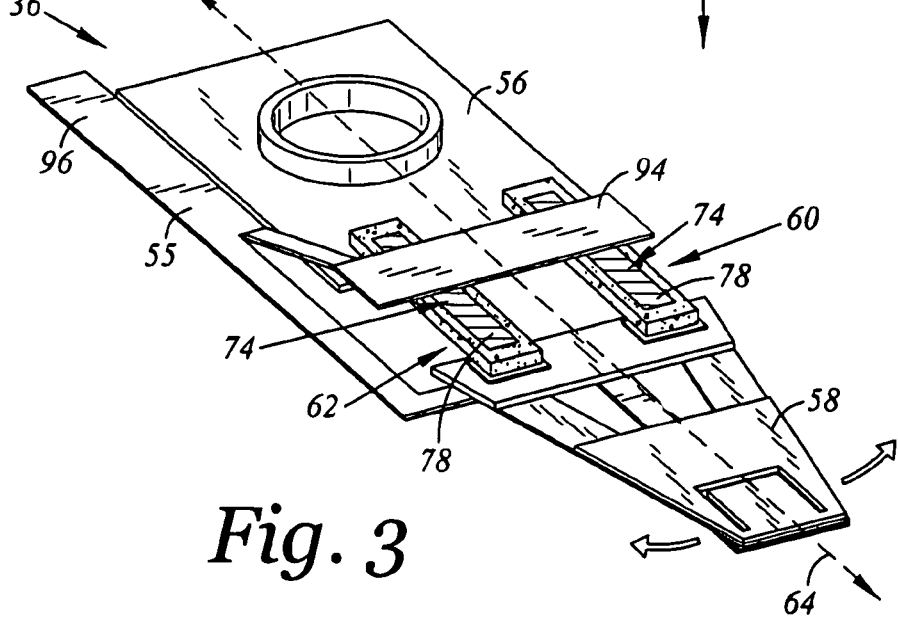
FIG. 3 is a perspective top view of the portion of the head stack assembly of FIG. 2.

Referring now to FIGS. 2 and 3 there is depicted enlarged views of a portion of the suspension 36. In the embodiment shown, the suspension 36 includes a swage plate 56. The swage plate 56 is attached to the actuator arm 34. A load beam 58 is distally attached to the swage plate 56. A flex circuit assembly 55 extends along the swage plate 56 and the load beam 58. The flex circuit assembly 55 is electrically connected to the flex cable assembly 54. The head 38 may be attached to and electrically connected to the flex circuit assembly 55 at the load beam 58. In the particular embodiment shown, there are provided microactuators 60, 62 that are configured to move the head 38 relative to the actuator body 32. The microactuators 60, 62 may be used to move the head 38 relative to a longitudinal axis 64 extending radially from the axis of rotation 40 along the actuator arm 34 and along the swage plate 56. Arrow indicators are shown to indicate direction of movement of the head 38 due to actuation of the microactuators 60, 62. As such, the microactuators 60, 62 may be utilized to "fine tune" controlled movement of the head 38 in comparison the course adjustments facilitated by the overall rotation of the rotary actuator 30 about the axis of rotation 40. To accomplish such "fine tuning" the microactuators 60, 62 may have greater bandwidth, but lesser stroke, than the voice coil motor. The microactuators 60, 62 are discussed in detail below and the microactuator 60 shown in further detail in FIGS. 21-25.

The microactuators 60, 62 may be electrically connected to the flex circuit assembly 55. The flex circuit assembly 55 may include a plurality of traces 66 that are electrically connected to the head 36. The traces 66 may be disposed upon a dielectric layer comprising a nonconductive material. The flex circuit assembly 55 may further include microactuator traces 68, 70 that are electrically connected to the microactuators 60, 62. The flex circuit assembly 55 may include a tab portion 94 that extends from a main portion 96 of the flex circuit assembly 55. The microactuator traces 68, 70 may extend along the tab portion 94.

While in the embodiment shown there are two such microactuators 60, 62 shown, it is contemplated that only a single microactuator may be utilized, as well as more than two microactuators may be utilized. Moreover, while in the embodiment shown the microactuators 60, 62 are disposed between the swage plate 56 and the load beam 58, the microactuators 60, 62 may be utilized at other locations about the rotary actuator 30. For example, it is contemplated that microactuators may be positioned and used in a load beam to facilitate relative movement between different portions of such load beam. As another example, it is contemplated that the microactuators may be positioned and used in an actuator arm to facilitate relative movement between different portions of such actuator arm.

According to an embodiment as shown, there is provided the disk drive 10. The disk drive 10 includes the disk drive base 16. The disk drive 10 further includes the spindle motor 24 coupled to the disk drive base 16. The disk drive 10 includes a coarse actuator, such as the rotary actuator 30 that is rotatably coupled to the disk drive base 16. The disk drive further includes a microactuator, such as the microactuator 60 that is coupled to the rotary actuator 30. Referring additionally to FIGS. 21-25, there is depicted an enlarged view of the microactuator 60. The microactuator 60 includes a piezoelectric element 72 defining a first element side 74. The first element side 74 includes a first peripheral portion 76 and a first exposed portion 78 disposed interior to the first peripheral portion 76. The microactuator 60 further includes a first electrically conductive layer 80 disposed upon the first peripheral portion 76 and the first exposed portion 78. The microactuator 60 further includes an encapsulation layer 82 disposed over the first peripheral portion 76 and not over the first exposed portion 78. The encapsulation layer 82 comprises a material of lesser electrical conductivity than the electrically conductive layer 80.

Figure 25:
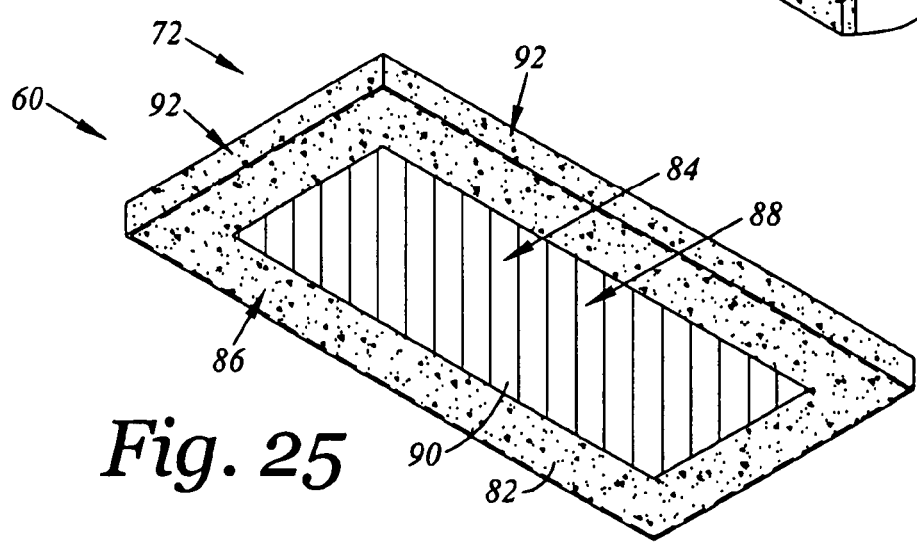
FIG. 25 is a bottom perspective view of the microactuator of FIG. 21.

According to various embodiments, the piezoelectric element 72 further defines a second element side 84 opposite the first element side 74 as illustrated in FIG. 25. The second element side 84 may include a second peripheral portion 86 and a second exposed portion 88 disposed interior to the second peripheral portion 86. A second electrically conductive layer 90 may be disposed upon the second peripheral portion 86 and the second exposed portion 88. The encapsulation layer 82 may be further disposed over the second peripheral portion 86 and not the second exposed portion 88. In this regard, the piezoelectric element 72 may further include lateral element sides 92 disposed between the first and second element sides 74, 84. In the embodiment shown, the encapsulation layer 82 extends upon the first peripheral portion 76, the lateral element sides 92, and the second peripheral portion 86.

In the embodiment shown, the microactuators 60, 62 are electrically connected to the microactuator traces 68, 70 at the first element side 74 via the first electrically conductive layer 80. It is contemplated that the second electrically conductive layer 90 need not be electrically connected to any of the traces, such as shown. However, the second electrically conductive layer 90 could be electrically connected to additional traces in order to establish a voltage potential across the piezoelectric element 72 for actuation of the microactuators 60, 62. The first and second electrically conductive layers 80, 90 comprise electrically conductive material. Suitable materials include metals, such as gold and copper.

The piezoelectric element 72 exhibits a change in physical geometry in response to the application of a voltage potential across at least a portion of such piezoelectric element 72. Such change in physical geometry includes expansion or contraction in specific dimensions, as well as bending or twisting movements. The piezoelectric element 72 may be formed of materials which may be chosen from those which are well known to one of ordinary skill in the art. An example of a suitable material used for the piezoelectric element 72 is PZT (Lead Zirconate Titanate). The piezoelectric element 72 may be generally rectangular shaped such as shown. However, the piezoelectric element 72 may have other shapes, including more complex geometries including those with curvatures and/or non-uniform thicknesses.

In the embodiment shown, the piezoelectric elements 72 of the microactuators 60, 62 are configured to expand and contract in a lengthwise direction generally parallel to the longitudinal axis 64. By selectively energizing the microactuator traces 68, 70, the piezoelectric elements 72 of the microactuators 60, 62 may be actuated to expand and/or contract at differing times and magnitude. This would result in the load beam 58 moving with respect to the longitudinal axis 64 for controlled movement of the attached head 38. Thus, a secondary or fine actuation may be achieved relative to the primary or coarse actuation as implemented by the pivoting movement of the rotary actuator 30 about the axis of rotation 40.

By their nature suitable materials used to form the piezoelectric element 72 have the potential to be a source of particle shedding. Such particles are considered a contamination source within the disk drive 10. As such, it is desirable to cover or otherwise coat the piezoelectric element 72 with a material so as to mitigate such particle shedding. In this regard, the outer surfaces of the piezoelectric element 72 are coated with the first electrically conductive layer 80 and the encapsulation layer 82. In the particular embodiment shown, the second electrically conductive layer 90 is further utilized for covering the piezoelectric element 72.

During the manufacture of the piezoelectric element 72 according to the method as discussed below, a sheet of piezoelectric material is provided that is repeatedly cut to form a multitude of piezoelectric elements. It is contemplated that while in such sheet form the entire sides of the sheet may be efficiently coated with conductive material so as to form the first and second electrically conductive layers 80, 90 of the yet to be formed piezoelectric element 72. However, due to the nature of this manufacture process the lateral sides of the various ones of the newly cut piezoelectric elements are exposed piezoelectric material. It is desirable to coat such lateral sides so as to encapsulate the piezoelectric material.

Figure 22:
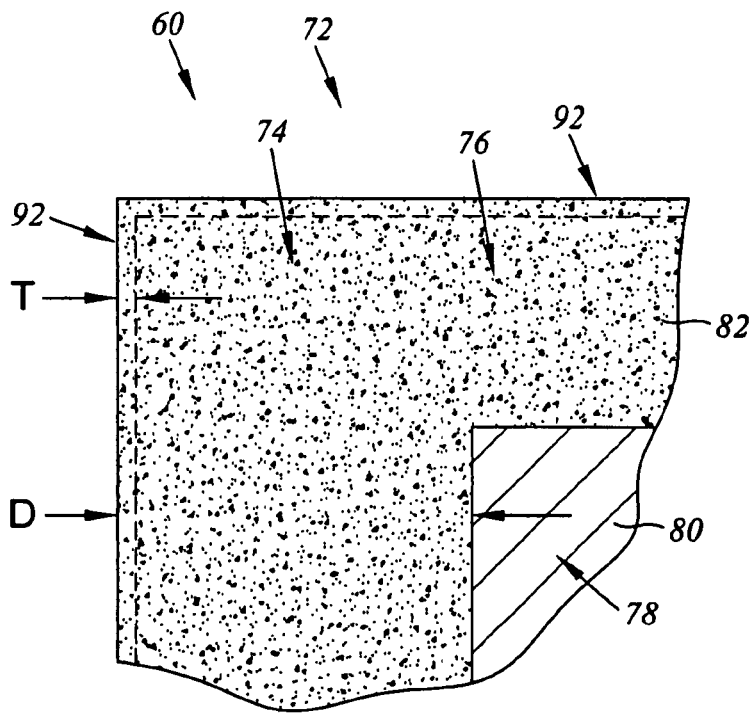
FIG. 22 is an enlarged portion of the top plan view of the microactuator of FIG. 21.
Figure 23:
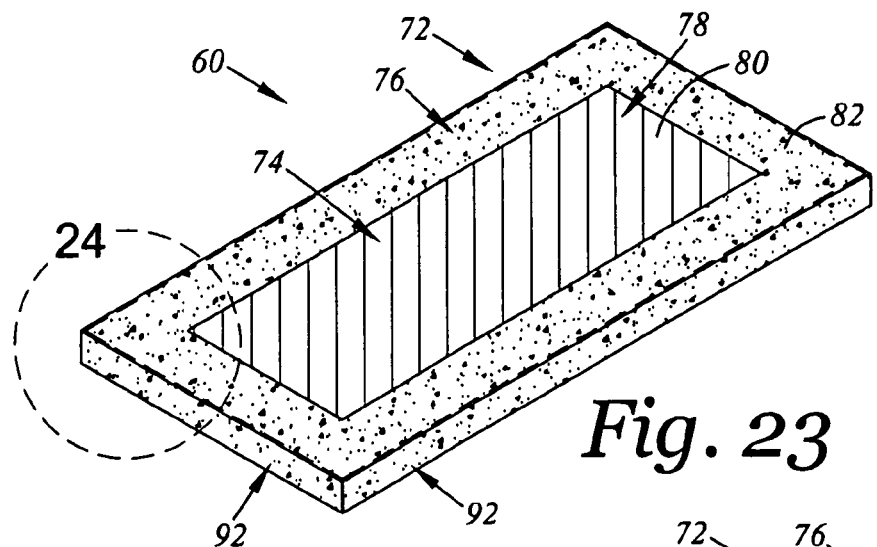
FIG. 23 is top perspective view of the microactuator of FIG. 21.
Figure 24:
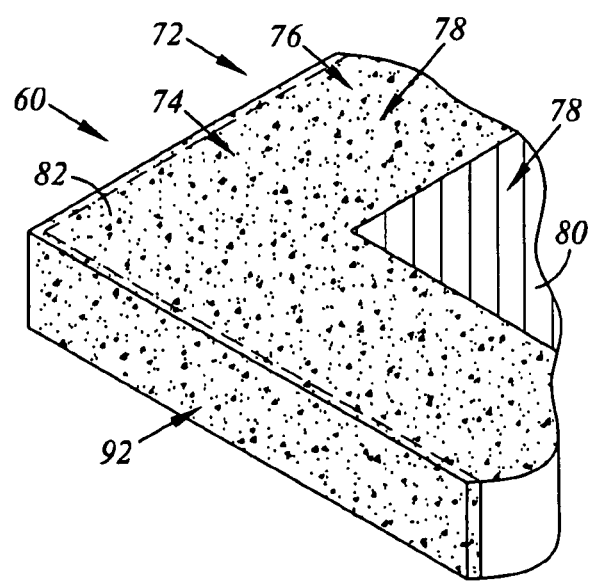
FIG. 24 is an enlarged portion of the top perspective view of the microactuator of FIG. 23.

An aspect of the present invention recognizes that merely coating the lateral sides does not provide sufficient mitigation of possible shedding of particles associated with the piezoelectric material. This is because the coating of the lateral sides might not completely coat the lateral sides as intended. In addition, due to the inherent nature of the piezoelectric material changing its geometry during actuation, repetitive actuation could result in an opening of the "seam" at the lateral sides. This could allow for the release of the particles of the piezoelectric material. As such, the particular disposition of the encapsulation layer 82 being disposed over the first peripheral portion 76 and not over the first exposed portion 78 ensure a degree of overlap so as to comprehensively cover the piezoelectric material within at such seam at the first element side 74. Likewise, the encapsulation layer 82 may be further disposed over the second peripheral portion 86 and not over the second exposed portion 88 for overlapping coverage at the second element side 84. As seen in FIG. 22, the encapsulation layer 82 is disposed upon the lateral element sides 92 to a thickness "T." The thickness T may be between 1 and 1000 nanometers for example. In the horizontal direction of FIG. 22, the encapsulation layer 82 overlaps the first electrically conductive layer 80 by distance equal to the difference between the distance "D" and the thickness "T." Examples of suitable materials for the encapsulation layer 82 may include a polymeric material Parylene, EGC-1700 under the trademark NOVEC manufactured by 3M Company, and Z-Tetraol manufactured by Ausimont, a polymer under the trademark ST-Poly manufactured by Achilles Corporation.

According to another aspect of the invention, there is provided the disk drive 10. The disk drive 10 includes the disk drive base 16, the spindle motor 24 coupled to the disk drive base 16, a coarse actuator (such as the actuator 30) rotatably coupled to the disk drive base 16, and a microactuator (such as microactuator 60) coupled to the coarse actuator. The microactuator 60 is as discussed above.

Figure 4:
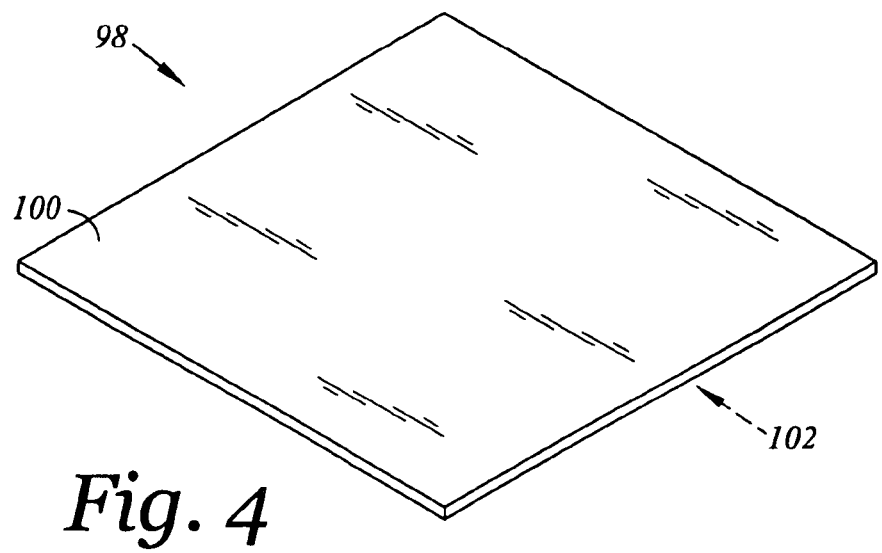
FIG. 4 is a perspective view of a sheet of piezoelectric material.
Figure 5:
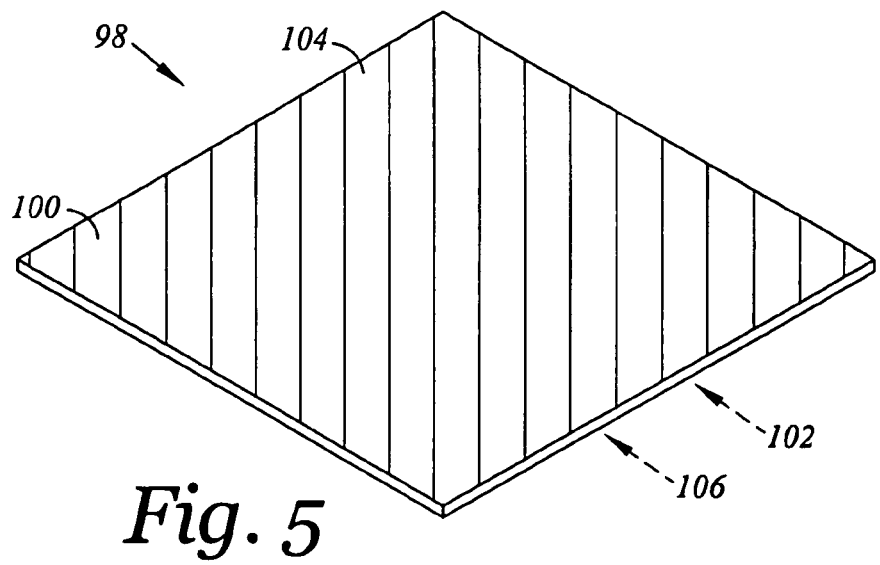
FIG. 5 is a perspective view of the sheet of piezoelectric material of FIG. 4 with an electrically conductive layer.

With reference to FIGS. 4-20, according to another embodiment of the invention, there is provided a method of manufacturing microactuators (such as the microactuator 60) for use in a disk drive (such as disk drive 10). Referring to FIGS. 4 and 5, the method includes an act of providing a sheet 98 of a piezoelectric material having a first electrically conductive layer 104 on at least one side of the sheet 100. FIG. 4 depicts the sheet 98 of piezoelectric material. The sheet 96 includes a first sheet side 100 and an opposing second sheet side 102 (indicated in dashed line as it is not seen in this view). FIG. 5 depicts the sheet 98 of piezoelectric material with the first electrically conductive layer 104 on the first sheet side 100. Though not seen in this view, it is contemplated that a second electrically conductive layer 106 (indicated in dashed line as it is not seen in this view) may be disposed upon second sheet side 102 as well. The first and second electrically conductive layers 104, 106 may be formed of any electrically conductive material, such as a metal such as gold, nickel or copper, in single or multiple layers. The first and second electrically conductive layers 104, 106 may have a thickness of 0.05 to 0.4 micrometers for example.

Figure 6:
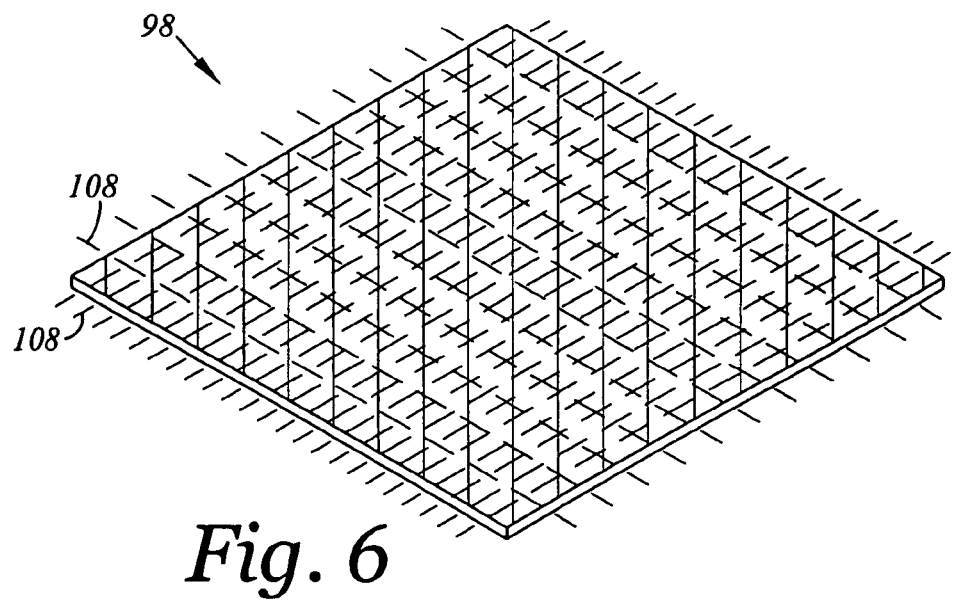
FIG. 6 is a perspective view of the sheet of FIG. 5 with intended cut-lines shown.
Figure 7:
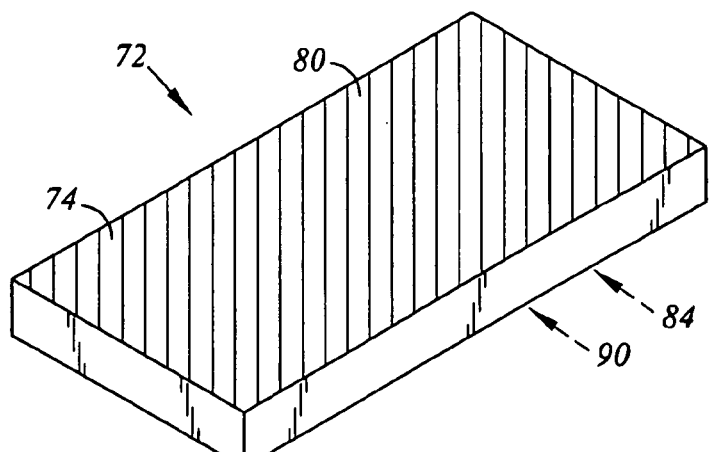
FIG. 7 is a perspective view of a piezoelectric element.

Referring now to FIG. 6 there is depicted the sheet 98 of piezoelectric material of FIG. 5 as shown with a multitude of intended cut-lines 108. The method further includes the act of cutting the sheet 98 to form a plurality of piezoelectric elements. A single piezoelectric element 72 is shown in FIG. 7 that would correspond to such an element as produced as a result of the cutting operation along the cut-lines 108. It is understood that the arrangement of the cut-lines 108 dictate the resultant geometry of the piezoelectric element 72. As described above, each of the piezoelectric elements 72 includes the first element side 74 with the first electrically conductive layer 80. Each of the piezoelectric elements 72 includes a second element side 84 (indicated in dashed line as it is not seen in this view) opposite the first element side 74. Each second element side 84 may include the second electrically conductive layer 90 (indicated in dashed line as it is not seen in this view).

As discussed above with reference to FIGS. 21-25, each first element side 74 includes the first peripheral portion 76. Each first element side further includes the first exposed portion 78 disposed interior to the first peripheral portion 76. Each second element side 84 may include the second peripheral portion 86. Each second element side may further include the second exposed portion 88 disposed interior to the second peripheral portion 86. The method further includes the act of forming the encapsulation layer 82 over the first peripheral portion 76 and not over the first exposed portion 78 of the first element side 74. As used herein, the encapsulation layer 82 is used to refer to any material of lesser electrical conductivity than the first electrically conductive layer 80. The method may further include the act of forming the encapsulation layer 82 over the second peripheral portion 86 and not over the second exposed portion 88 of the second element side 84. The encapsulation layer 82 comprises a material of lesser electrical conductivity than the second electrically conductive layer 90. In this regard, the encapsulation layer 82 may have an electrical conductivity on the order of 1e-15 (1/Ohm*1/m) for Parylene and 5e-10 (1/Ohm*1/m) for EGC-1700, for example. The first and second electrically conductive layer 80, 90 may have an electrical conductivity on the order of 49e6 (1/Ohm*1/m) for gold and 15e6 (1/Ohm*1/m) for nickel. FIGS. 8-20 illustrate an embodiment of the method that facilitates the application of the encapsulation layer 82 upon the piezoelectric element 72 in the context for manufacturing a plurality of microactuators 60.

Figure 8:
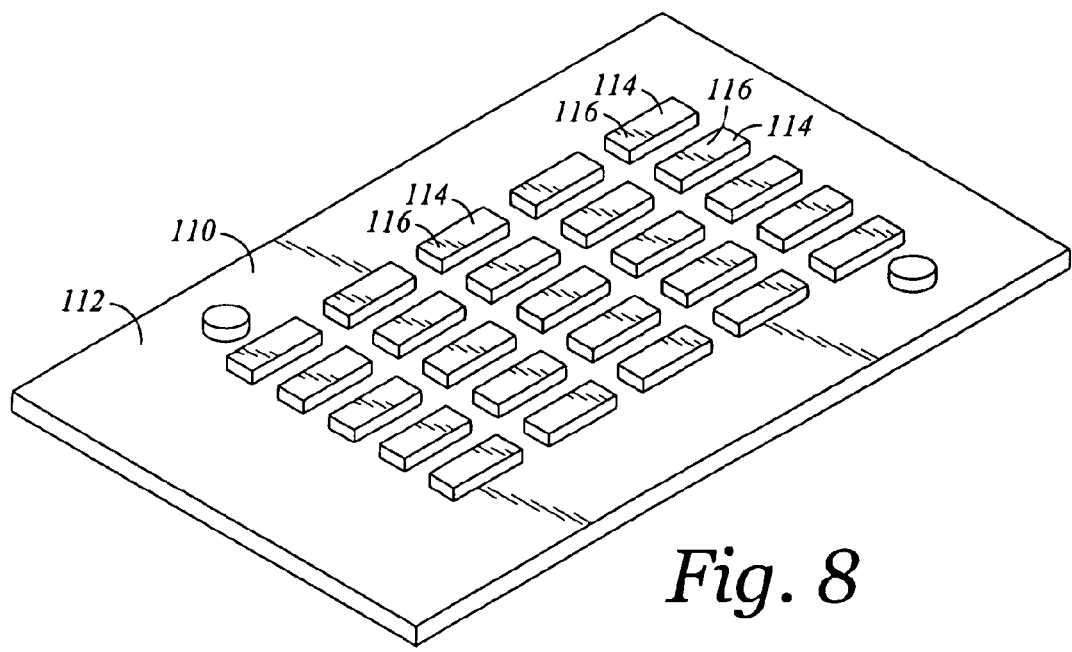
FIG. 8 is a perspective view of a first fixture.

Referring now to FIG. 8, the act of forming the encapsulation layer 82 may include providing a first fixture 110. The first fixture 110 includes a fixture base 112 and a plurality of protrusions 114 extending from the fixture base 112. Each protrusion 114 includes a distal support surface 116. As will be seen in later figures and discussed below, the distal support surface 116 is approximately the same size as a first exposed portion 78 of a respective one of the first element sides 74 of the various piezoelectric elements 72.

Figure 9:
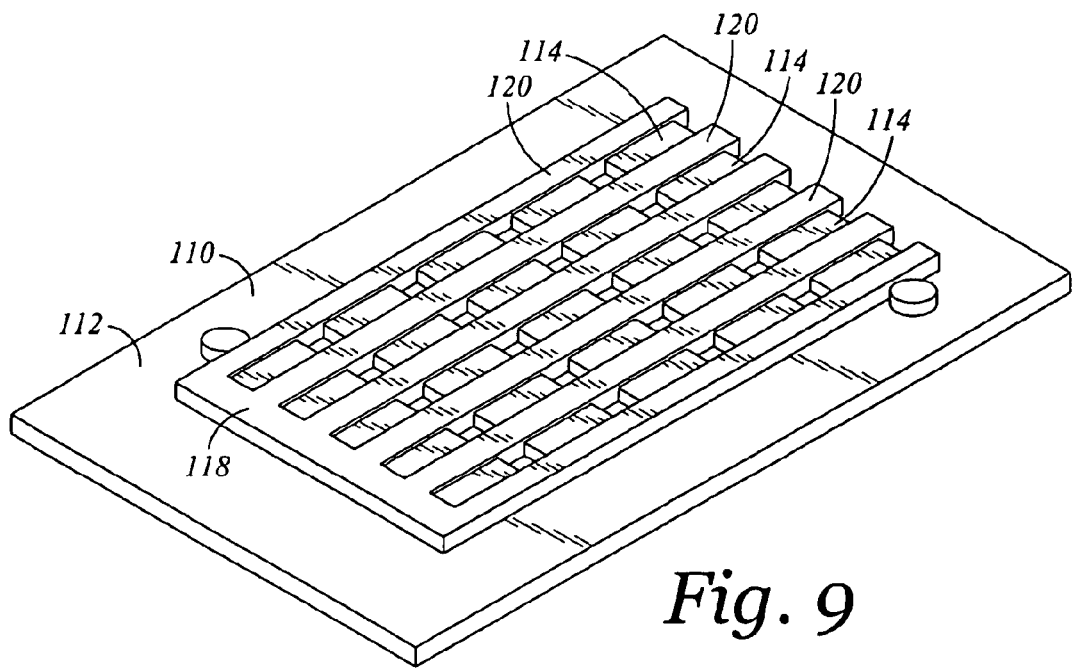
FIG. 9 is a perspective view of the first fixture of FIG. 8 with a first alignment comb.

Referring now to FIG. 9, a first alignment comb 118 may be provided. The first alignment comb 118 includes a plurality of first tines 120. The first alignment comb 118 is positioned upon the fixtures base 112 of the first fixture 110. The first tines 120 are aligned between various rows of the protrusions 114.

Figure 10:
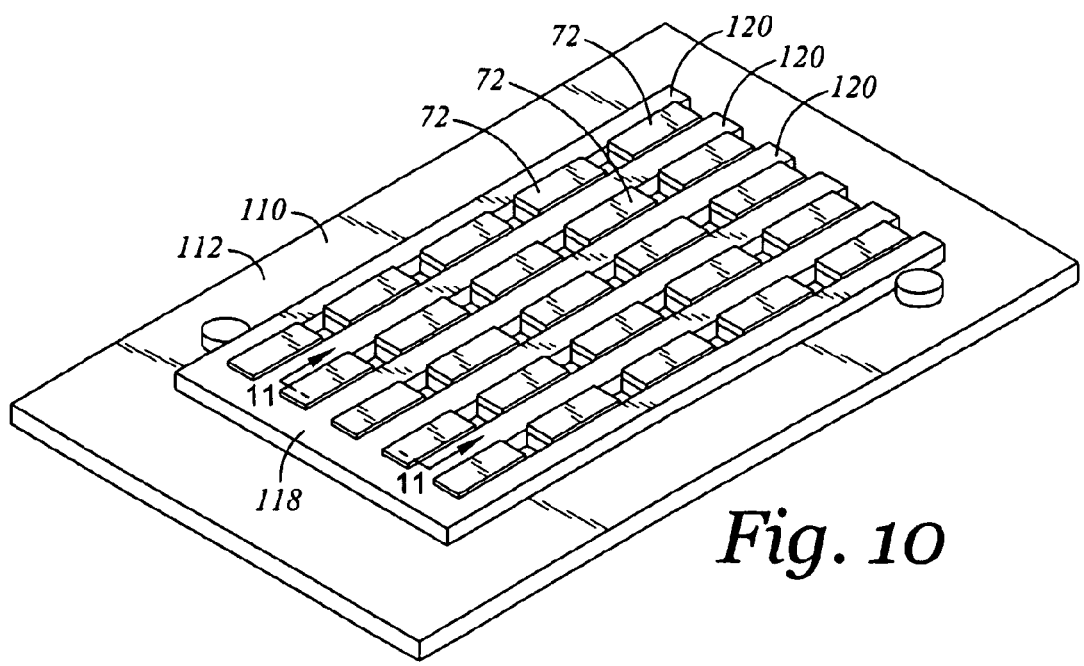
FIG. 10 is a perspective view of the first fixture and first alignment comb of FIG. 9 with piezoelectric elements.

Referring to FIG. 10, the act of forming the encapsulation layer 82 may include positioning each of the piezoelectric elements 74 upon a respective distal support surface 116 of the first fixture 110 with the respective first exposed portion 78 of a respective first element side 74 upon the distal support surface 116. The act of positioning may include using a first alignment comb 118 to position the piezoelectric elements 74 with respect to the first fixture 110. The piezoelectric elements 74 are positioned between respective ones of the first tines 120.

Figure 11:
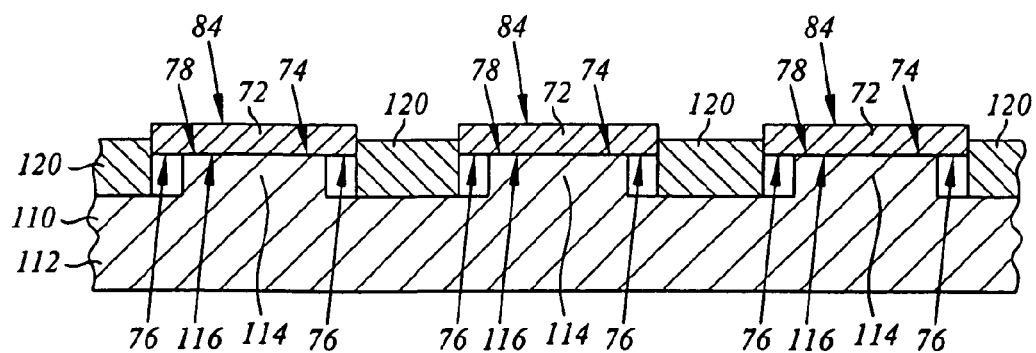
FIG. 11 is a cross-sectional view of the first fixture, the first alignment comb, and piezoelectric elements as seen along axis 11-11 of FIG. 10.

FIG. 11 is a cross-sectional view as seen along axis 11-11 of FIG. 10. As can be seen, the width of the distal support surface 116 of the first protrusions 114 is less than the width of the piezoelectric elements 74. While the piezoelectric elements 74 are shown in direct contact with the first tines 120, the spacing of such first tines 120 need not be so close as to result in such a direct contact. The spacing of the first tines 120 should be such as to ensure that the first element side 74 completely covers the distal support surface 116. As will be understood from the discussion below, the distal support surface 116 will result in a "footprint" that will facilitate the definition of the geometry of the first peripheral portion 76 and the first exposed portion 78.

As seen in the view of FIG. 11, the piezoelectric element 74 defines a thickness and the protrusions 114 have a protrusion height, and the first alignment comb 118 has a comb height as defined by a height of the first tines 120. In this embodiment, the comb height is greater than the protrusion height but less than the sum of the thickness and the protrusion height. This results in the piezoelectric elements 74 being raised in comparison to the first tines 120.

Figure 12:
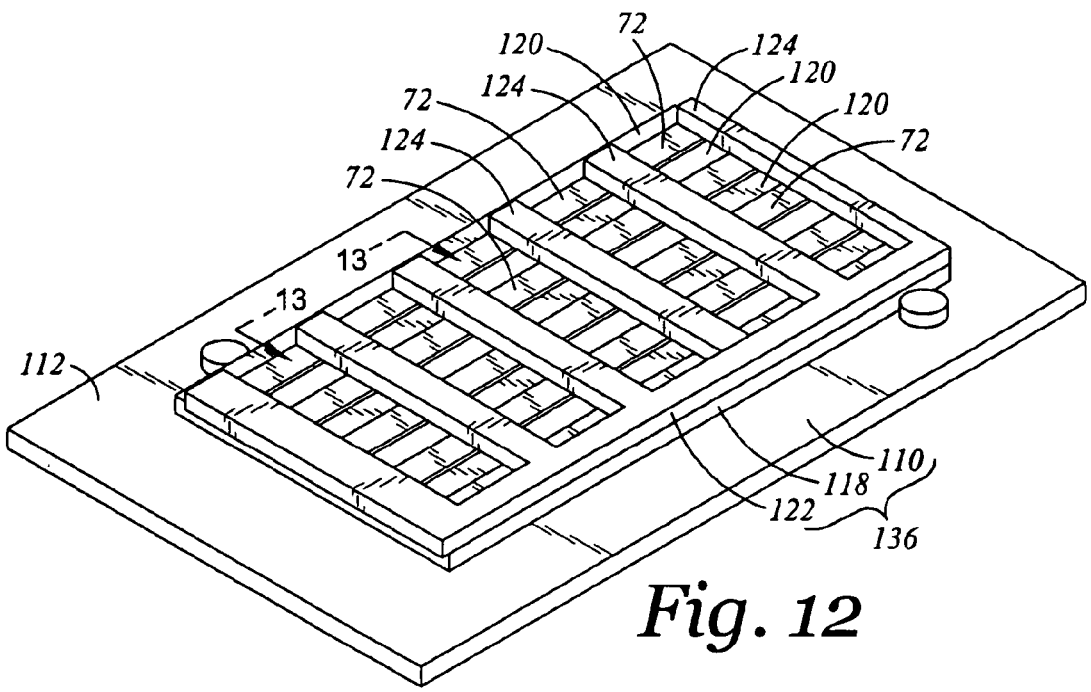
FIG. 12 is a perspective view of the first fixture, the first alignment comb, and the piezoelectric elements of FIG. 10 with a second alignment comb.

Referring now to FIG. 12, a second alignment comb 122 may be provided. The second alignment comb 122 includes a plurality of second tines 124. The act of positioning further includes using the second alignment comb 122 to position the piezoelectric elements 74 with respect to the first fixture 110. The piezoelectric elements 74 are positioned between respective ones of the second tines 124. The second alignment comb 122 is positioned with the second tines 124 being oriented approximately orthogonally relative to the first tines 120. As mentioned above, the piezoelectric elements 74 are raised in comparison to the first tines 120 as shown in FIG. 11. This allows the second tines 124 to engage the piezoelectric elements 74 when the second alignment comb 122 is positioned atop the first alignment comb 122.

Figure 13:
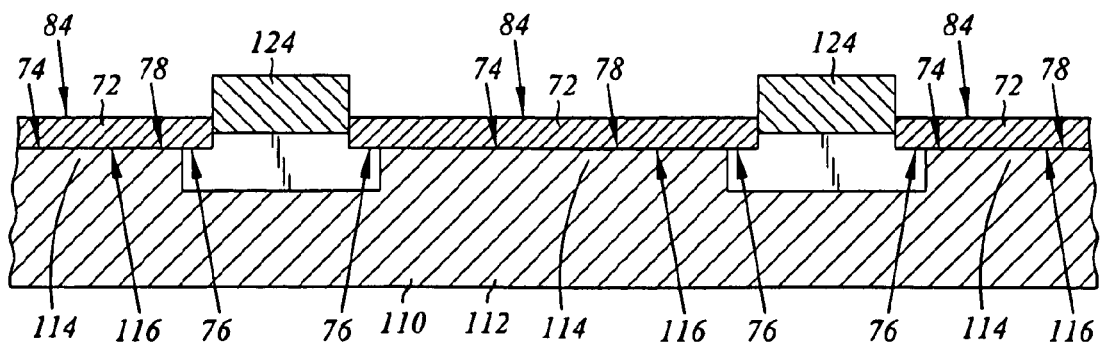
FIG. 13 is a cross-sectional view of the first fixture, the second alignment comb, and piezoelectric elements as seen along axis 13-13 of FIG. 12.

FIG. 13 is a cross-sectional view as seen along axis 13-13 of FIG. 12. As can be seen, the length of the distal support surface 116 of the first protrusions 114 is less than the length of the piezoelectric elements 74. While the piezoelectric elements 74 are shown in direct contact with the second tines 124, the spacing of such second tines 124 need not be so close as to result in such a direct contact. The spacing of the second tines 124 should be such as to ensure that the first element side 74 completely covers the distal support surface 116. As will be understood from the discussion below, the distal support surface 116 will result in a "footprint" that will facilitate the definition of the geometry of the first peripheral portion 76 and the first exposed portion 78.

Figure 14:
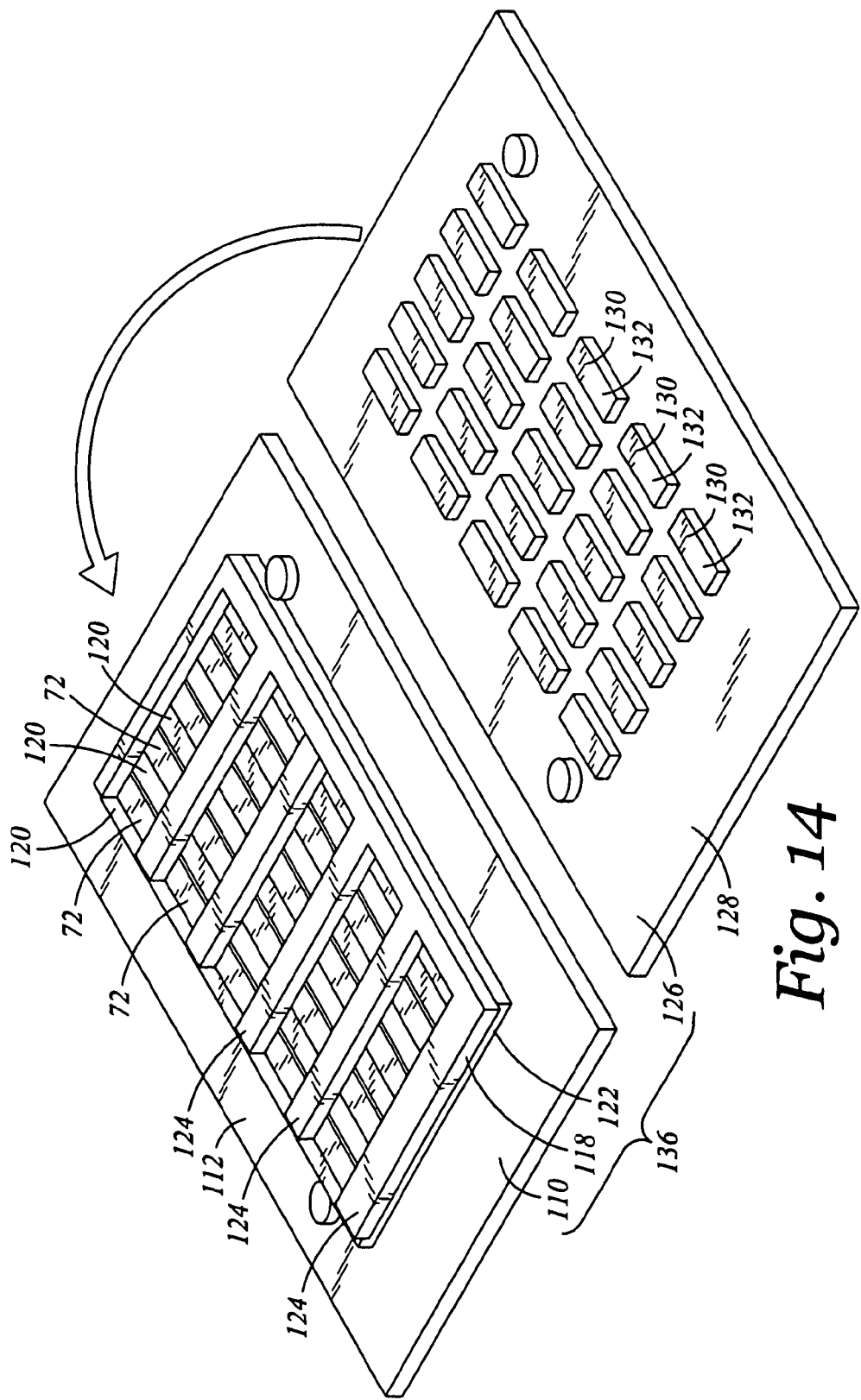
FIG. 14 is a perspective view of the first fixture, the first alignment comb, the piezoelectric elements, and the second alignment comb of FIG. 10 with a second fixture.
Figure 15:
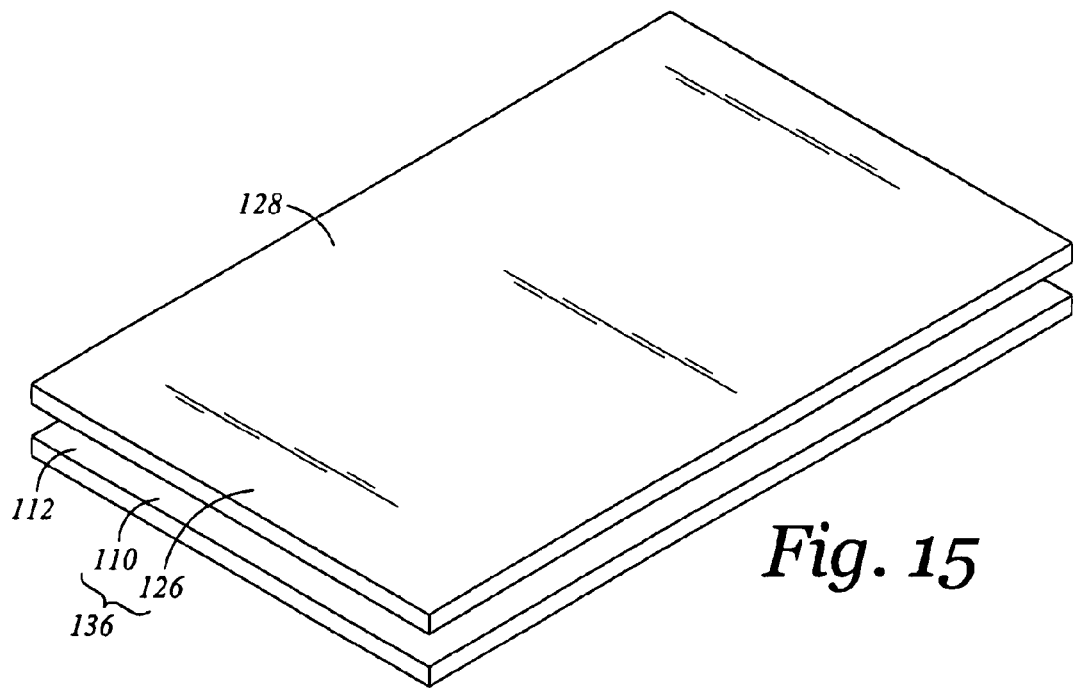
FIG. 15 is the perspective view of FIG. 10 with the second fixture positioned atop the first fixture.
Figure 16:
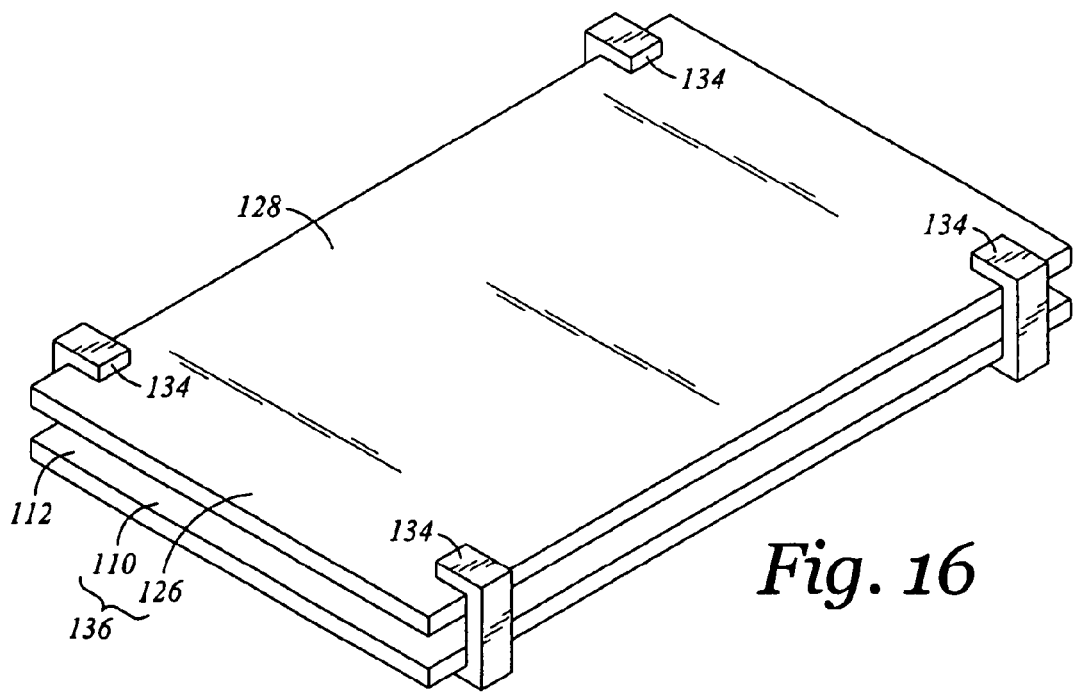
FIG. 16 is the perspective view of FIG. 15 with clamps.

Referring now to FIG. 14, a second fixture 126 may be provided. The method may further include providing the second fixture 126 that includes a fixture base 128 and a plurality of protrusions 130 extending from the fixture base 128. Each protrusion 130 includes a distal support surface 132 that is approximately the same size as a second exposed portion 88 of a respective one of the second element sides 84. Next, the method may further include positioning each of the piezoelectric elements 74 upon a respective distal support surface 132 of the second fixture 126 with the respective second exposed portion 88 of a respective second element side 84 upon the distal support surface 132. In this regard, as indicted by the motion arrow indicator in FIG. 14, the second fixture 126 is then flipped over and positioned upon the piezoelectric elements 74 as shown in FIG. 15. Next, the method may further include affixing the first and second fixtures 110, 126 relative to each other. As shown in FIG. 16, this may be accomplished through the use of clamps 134 for example.

Figure 17:
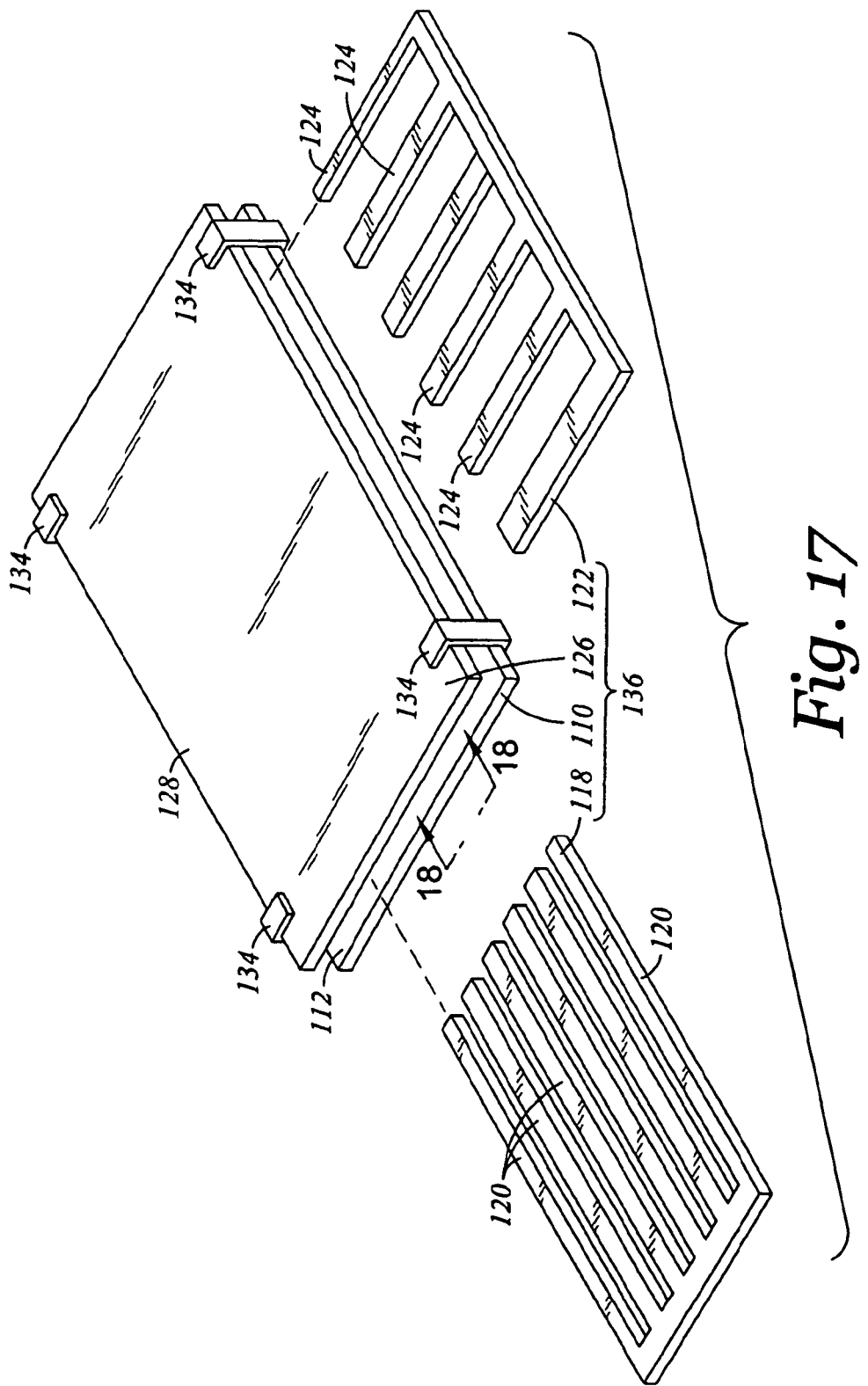
FIG. 17 is the perspective view of FIG. 16 with the first and second alignment combs exploded away from the first and second fixtures.
Figure 18:
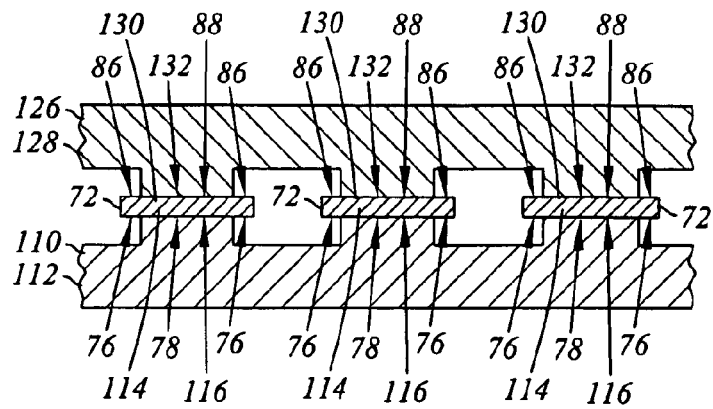
FIG. 18 is a cross-sectional view of the first fixture, piezoelectric elements, and the second fixture as seen along axis 18-18 of FIG. 17.

As shown in FIG. 17, the method may further include removing the first and second alignment combs 118, 122. The clamps 134 maintain the piezoelectric elements 74 between the first and second fixtures 110, 126. FIG. 18 is a cross-sectional view of the first and second fixtures 110, 118 and the piezoelectric elements 74 as seen along axis 18-18 of FIG. 17.

Figure 19:
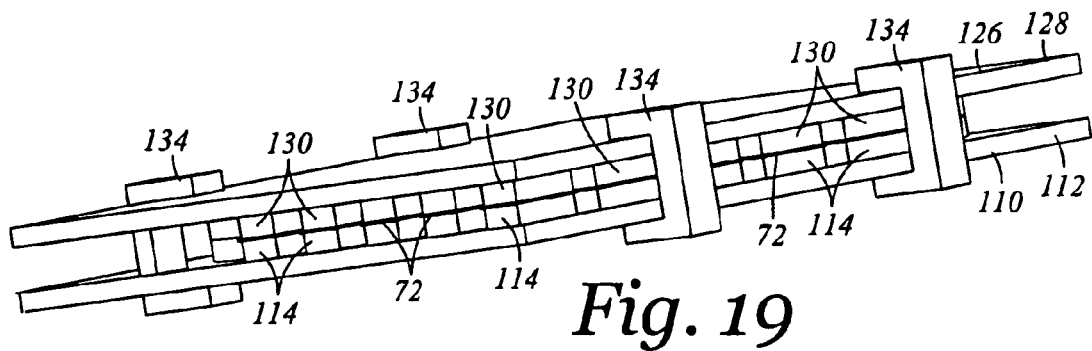
FIG. 19 is the first fixture, the piezoelectric elements, the second fixture, and the clamps of FIGS. 17 and 18 as seen from another perspective view.

FIG. 19 is a perspective view from another angle of the first and second fixtures 110, 118 and the piezoelectric elements of FIG. 17.

Figure 20:
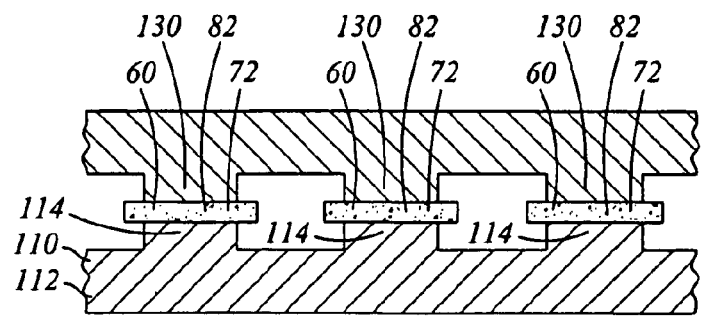
FIG. 20 is a cross-sectional view similar to the view of FIG. 18, however, with the piezoelectric elements having an encapsulation layer.
Figure 21:
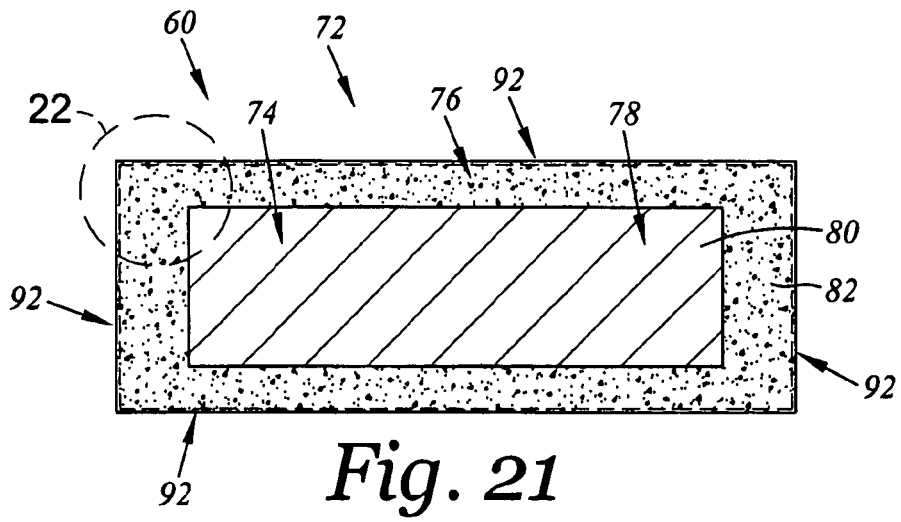
FIG. 21 is a top plan view of a microactuator.

The act of forming the encapsulation layer 82 may then proceed without the presence of the first and second alignment combs 118, 122 while the piezoelectric elements 74 are positioned between the affixed first and second fixtures 110, 118. In this regard, the first and second fixtures 110, 118 and the piezoelectric elements 74 may be exposed to a chemical bath or other deposition environment for application of the encapsulation layer 82 upon the piezoelectric elements 74. Referring now to FIG. 20, there is depicted a view similar to that of FIG. 18, however, after the application of the encapsulation layer 82 to the piezoelectric elements 74. The distal support surfaces 116, 132 are utilized to mask the first and second exposed portions 78, 88 from being exposed to encapsulation material when applying the encapsulation layer 82.

After the encapsulation, each of the piezoelectric elements 74 is removed from the first and second fixtures 110, 118 as it is now incorporated in a completed microactuator 60. The first and second fixtures 110, 118 may be formed of any variety of materials, such as steel or plastic. In addition, the surfaces of the first and second fixtures 110, 118 may have a solid or liquid coated surface, such as a polytetrafluoroethylene coating, to facilitate release of the microactuators 60 upon completion.

According to yet another aspect of the invention, there is provided an apparatus 136 for manufacturing a plurality of piezoelectric microactuators (such as microactuator 60). Each microactuator is for use in a disk drive (such as disk drive 10). The apparatus 136 includes the first fixture 110, the first alignment comb 118, and the second alignment comb 122 as discussed above. In addition, the apparatus 136 may further include the second fixture 126, also as discussed above.

We claim:

1. A method of manufacturing microactuators for use in a disk drive, the method comprising the acts of:
   (a) providing a sheet of a piezoelectric material having a first electrically conductive layer on a first side of the sheet;
   (b) cutting the sheet to form a plurality of piezoelectric elements, each of the piezoelectric elements including a first element side with a portion of the first electrically conductive layer, each first element side including a peripheral portion and an exposed portion disposed interior to the peripheral portion; and
   (c) forming an encapsulation layer over the peripheral portion and not over the exposed portion of at least one of the first element sides, the encapsulation layer comprising a material of lesser electrical conductivity than the first electrically conductive layer, wherein the act of forming includes
      (i) providing a first fixture including a fixture base and a plurality of protrusions extending from the fixture base, each protrusion including a distal support surface that is approximately the same size as an exposed portion of a respective one of the first element sides; and
      (ii) positioning each of the piezoelectric elements upon a respective distal support surface of the first fixture with the respective exposed portion of a respective first element side upon the distal support surface;
   wherein the act of positioning includes using a first alignment comb to position the piezoelectric elements with respect to the first fixture, the first alignment comb including a plurality of first tines, the piezoelectric elements being positioned between respective ones of the first tines.

2. The method of claim 1 wherein the act of positioning further includes using a second alignment comb to position the piezoelectric elements with respect to the first fixture, the second alignment comb including a plurality of second tines, the piezoelectric elements being positioned between respective ones of the second tines, the second tines being oriented approximately orthogonally relative to the first tines.

3. A method of manufacturing microactuators for use in a disk drive, the method comprising the acts of:
   (a) providing a sheet of a piezoelectric material having a first electrically conductive layer on a first side of the sheet;
   (b) cutting the sheet to form a plurality of piezoelectric elements, each of the piezoelectric elements including a first element side with a portion of the first electrically conductive layer, each first element side including a peripheral portion and an exposed portion disposed interior to the peripheral portion; and
   (c) forming an encapsulation layer over the peripheral portion and not over the exposed portion of at least one of the first element sides, the encapsulation layer comprising a material of lesser electrical conductivity than the first electrically conductive layer, wherein the act of forming includes
      (i) providing a first fixture including a fixture base and a plurality of protrusions extending from the fixture base, each protrusion including a distal support surface that is approximately the same size as an exposed portion of a respective one of the first element sides; and
      (ii) positioning each of the piezoelectric elements upon a respective distal support surface of the first fixture with the respective exposed portion of a respective first element side upon the distal support surface;
      (iii) providing a second fixture including a fixture base and a plurality of protrusions extending from the fixture base, each protrusion including a distal support surface that is approximately the same size as an exposed portion of a respective one of the second element sides, and positioning each of the piezoelectric elements upon a respective distal support surface of the second fixture with the respective exposed portion of a respective second element side upon the distal support surface; and
      iv) using a first alignment comb to position the piezoelectric elements with respect to the second fixture, the first alignment comb including a plurality of first tines, the piezoelectric elements being positioned between respective ones of the first tines.

4. The method of claim 3 further comprising using a second alignment comb to position the piezoelectric elements with respect to the second fixture, the second alignment comb including a plurality of second tines, the piezoelectric elements being positioned between respective ones of the second tines, the second tines being oriented approximately orthogonally relative to the first tines.

5. The method of claim 4 further comprising affixing the first and second fixtures relative to each other and subsequently removing the first and second alignment combs, the act of forming occurring while the piezoelectric elements are positioned between the affixed first and second fixtures.

* * * * *